United States Patent [19]

Chang et al.

[11] Patent Number: 5,587,332
[45] Date of Patent: Dec. 24, 1996

[54] METHOD OF MAKING FLASH MEMORY CELL

[75] Inventors: Kuang-Yeh Chang, Los Gatos; Subhash R. Nariani; William J. Boardman, both of San Jose, all of Calif.

[73] Assignee: VLSI Technology, Inc., San Jose, Calif.

[21] Appl. No.: 938,727

[22] Filed: Sep. 1, 1992

[51] Int. Cl.⁶ ............................................. H01L 21/8247
[52] U.S. Cl. ............................ 437/43; 437/52; 257/316
[58] Field of Search ........................ 437/43, 48, 52; 365/185; 257/315, 316, 319, 320

[56] References Cited

U.S. PATENT DOCUMENTS

| | | | |
|---|---|---|---|
| 4,477,883 | 10/1984 | Wada | 365/185 |
| 4,794,565 | 12/1988 | Wu et al. | 365/185 |
| 4,920,393 | 4/1990 | Kawakami | 357/23.8 |
| 4,945,068 | 7/1990 | Sugaya | 437/52 |
| 4,957,878 | 9/1990 | Lowrey et al. | 437/52 |
| 5,017,980 | 5/1991 | Gill et al. | 357/23.5 |
| 5,033,023 | 7/1991 | Hsia et al. | 365/185 |
| 5,041,886 | 8/1991 | Lee | 357/23.5 |
| 5,081,054 | 1/1992 | Wu et al. | 437/43 |
| 5,101,250 | 3/1992 | Arima et al. | 357/23.5 |
| 5,104,819 | 4/1992 | Freiberger et al. | 437/43 |
| 5,120,673 | 6/1992 | Itoh | 437/44 |
| 5,134,085 | 7/1992 | Gilgen et al. | 437/52 |
| 5,175,119 | 12/1992 | Matsutani | 437/43 |
| 5,268,318 | 12/1993 | Harari | 437/43 |
| 5,279,981 | 1/1994 | Fukatsu et al. | 437/43 |
| 5,284,786 | 2/1994 | Sethi | 437/43 |
| 5,292,681 | 3/1994 | Lee et al. | 437/48 |

OTHER PUBLICATIONS

"A Novel High-Speed, 5-Volt Programming EPROM Structure With Source-Side Injection", by A. T. Wu et al, IEEE, 1986, pp. 585–587.

Primary Examiner—Mary Wilczewski
Assistant Examiner—Richard A. Booth
Attorney, Agent, or Firm—Burns, Doane, Swecker & Mathis

[57] ABSTRACT

The present invention relates to a flash EEPROM cell using polysilicon-to-polysilicon hot electron emission to erase the memory contents of the cell. Exemplary embodiments include a side gate, a control gate, a floating gate and source and drain regions. Appropriate biasing of these gates and source and drain regions controls the electron population of the floating gate. The memory cells may be of either the double polysilicon or triple polysilicon variety. Peripheral transistors are formed from a last formed polysilicon layer to avoid degrading the peripheral transistors.

43 Claims, 10 Drawing Sheets

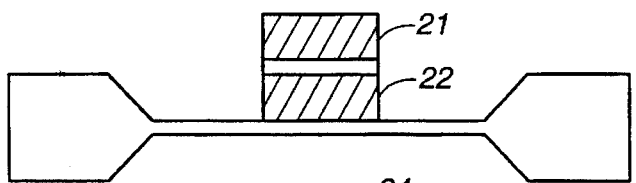
FIG._1a
(PRIOR ART)
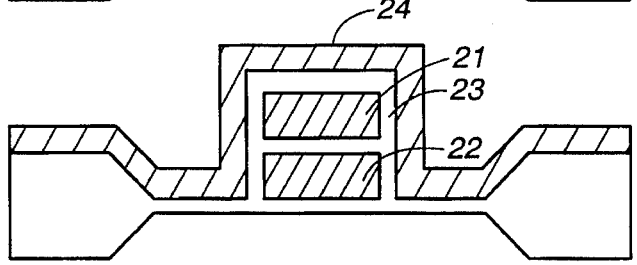
FIG._1b
(PRIOR ART)
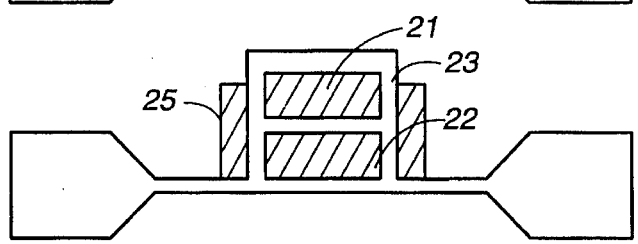
FIG._1c
(PRIOR ART)
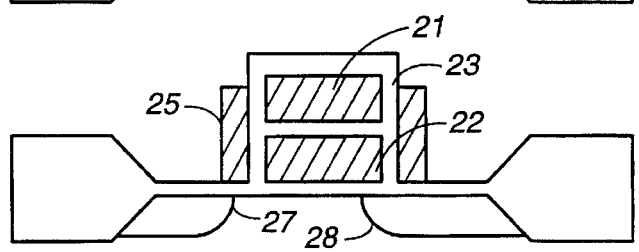
FIG._1d
(PRIOR ART)
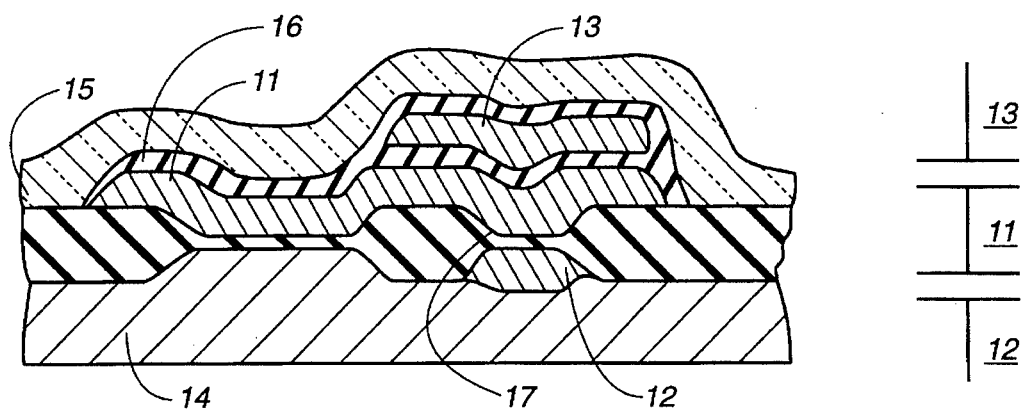
FIG._2a
(PRIOR ART)
FIG._2b
(PRIOR ART)

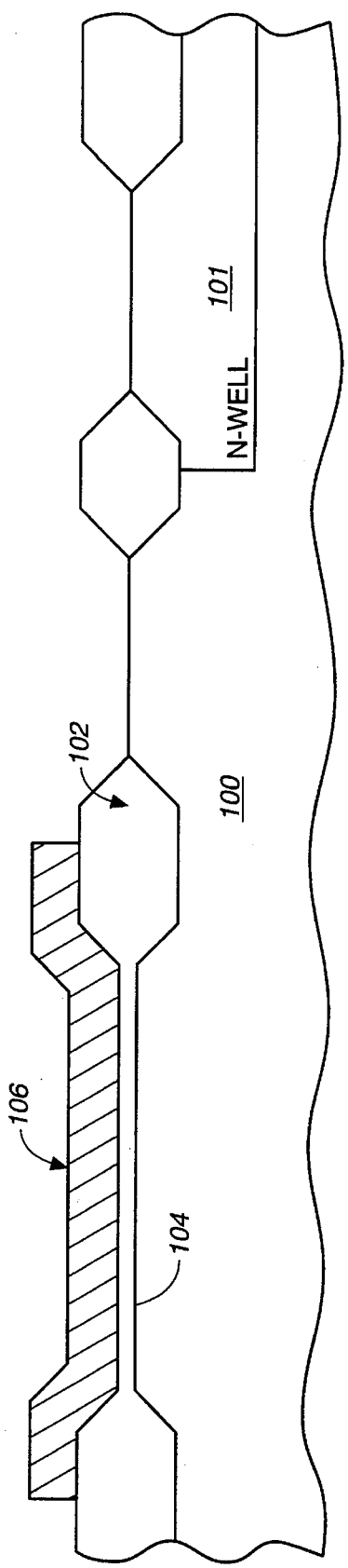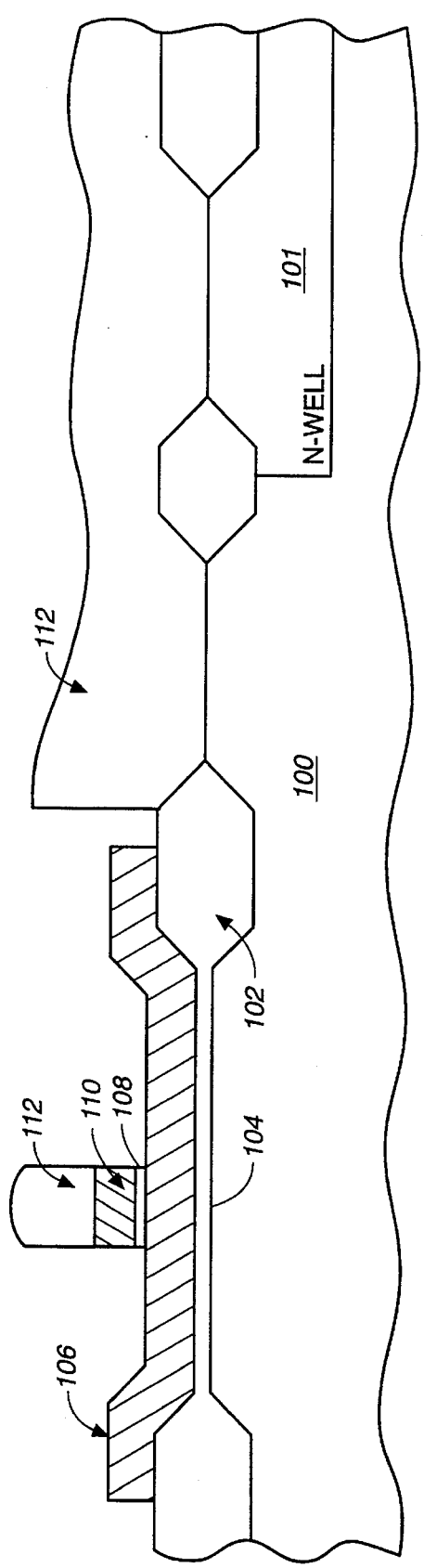
FIG._3a
FIG._3b

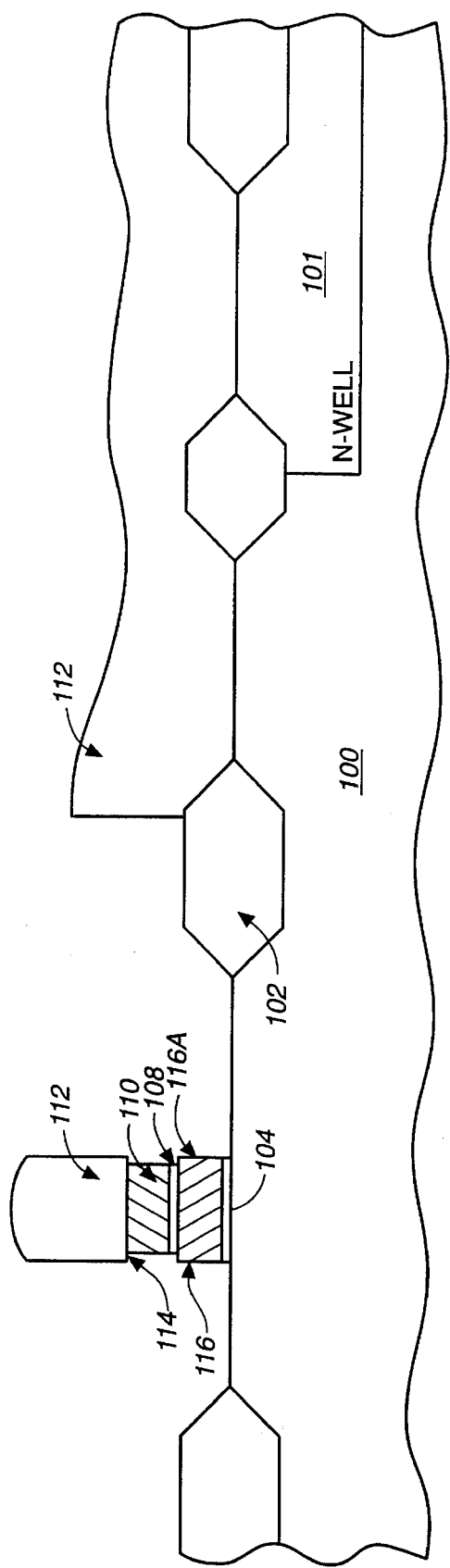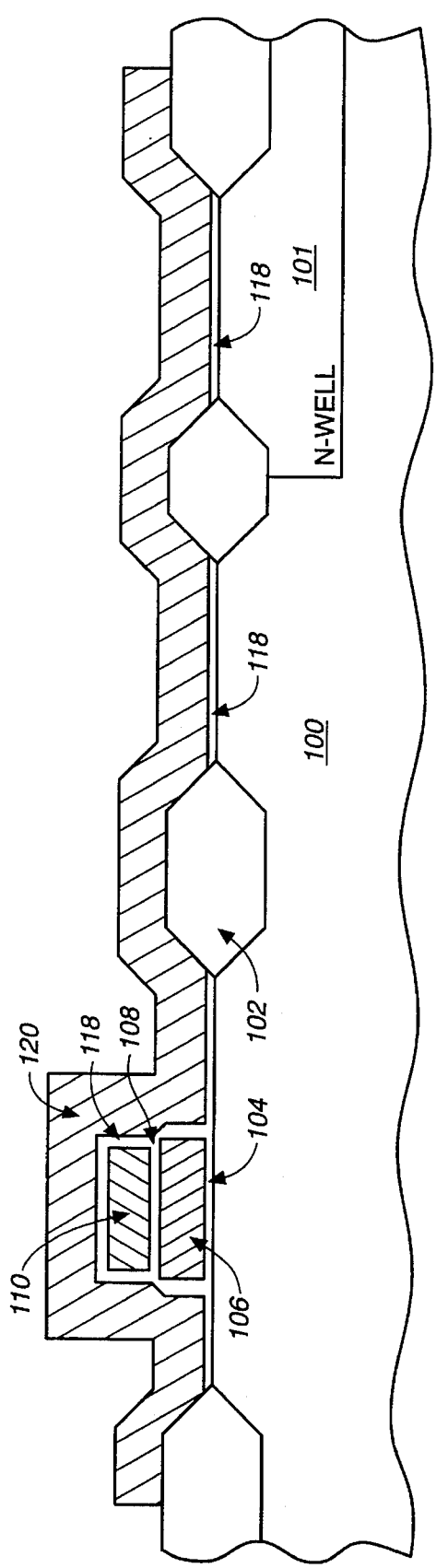

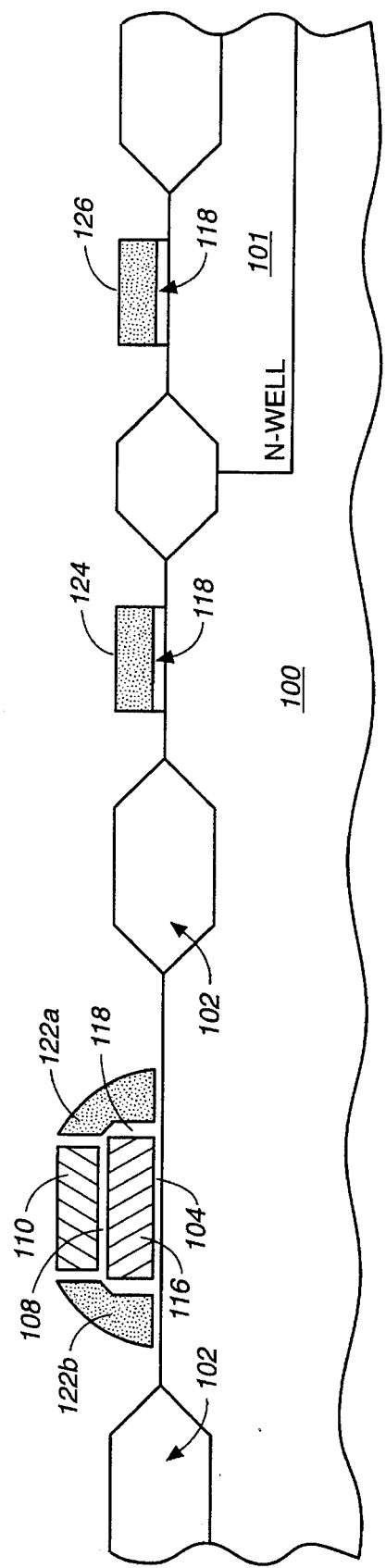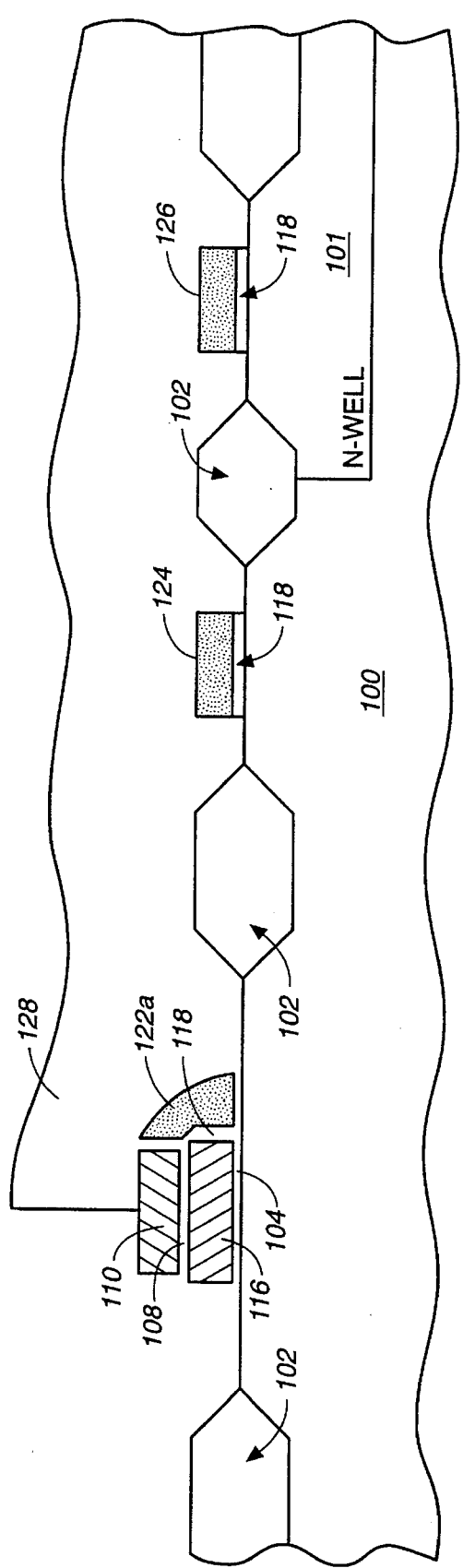

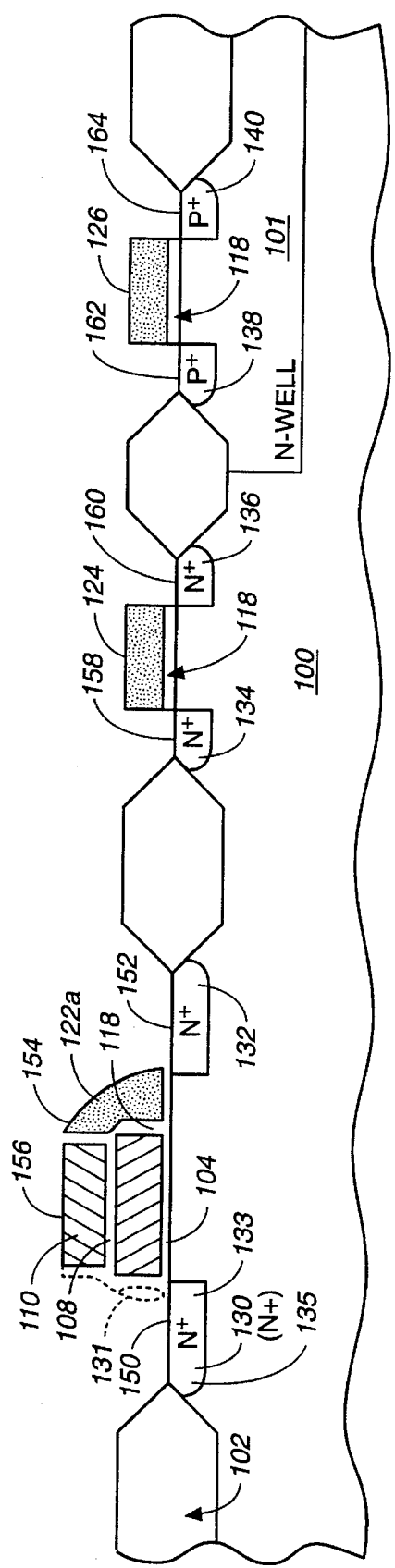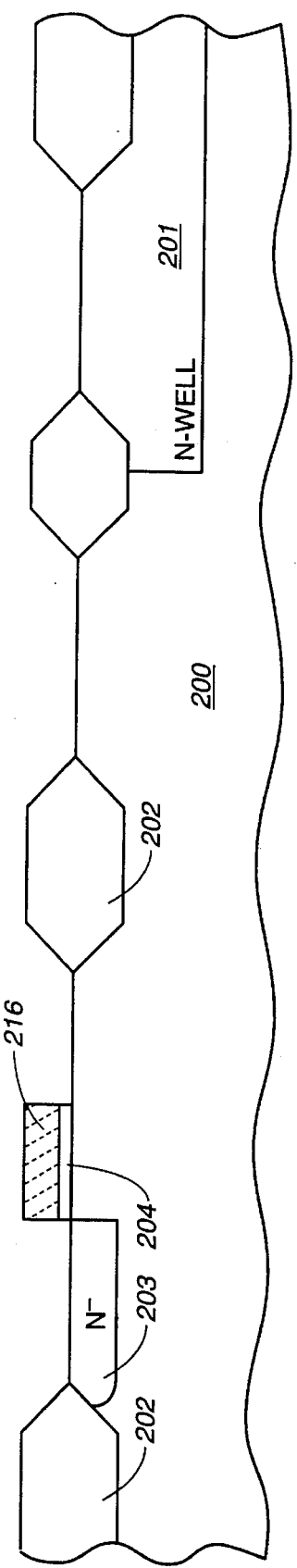
FIG.—3g
FIG.—4a

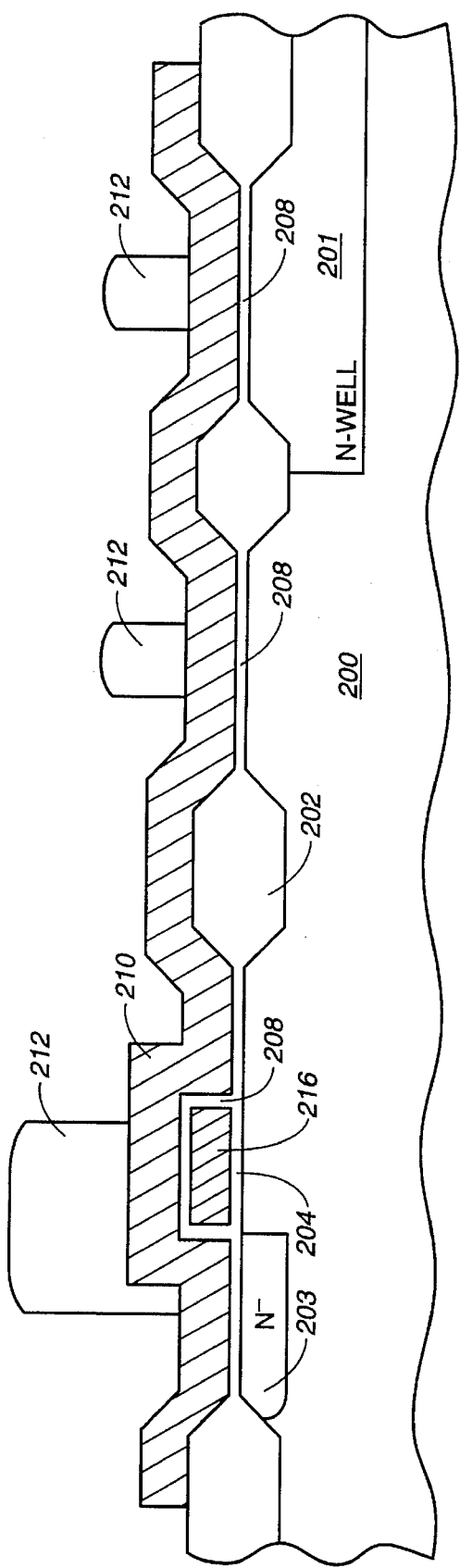
FIG._4b
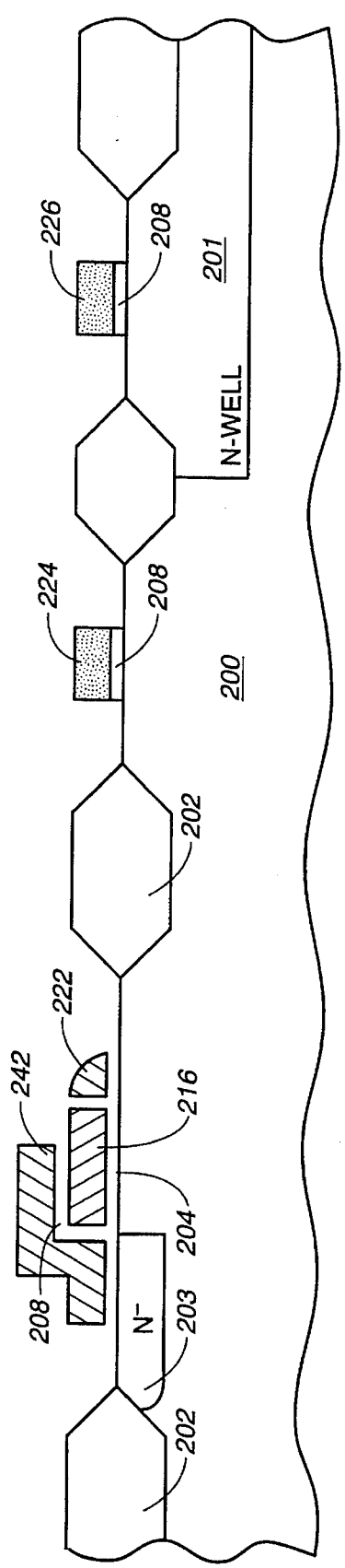
FIG._4c

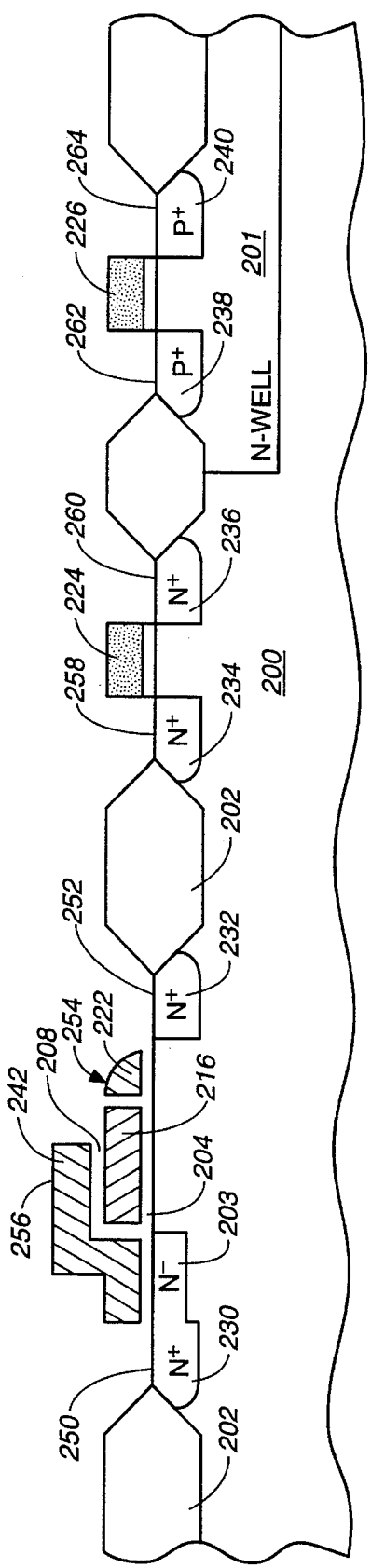
FIG._4d
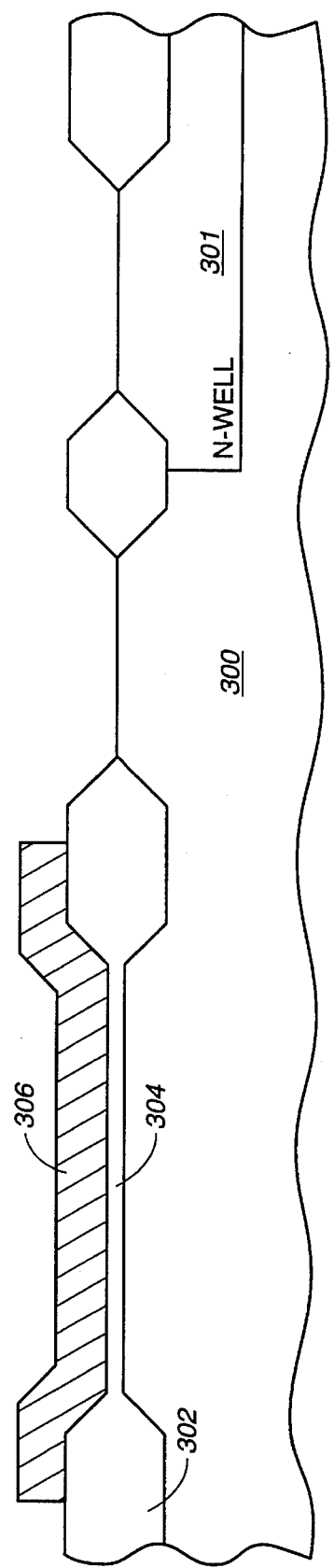
FIG._5a

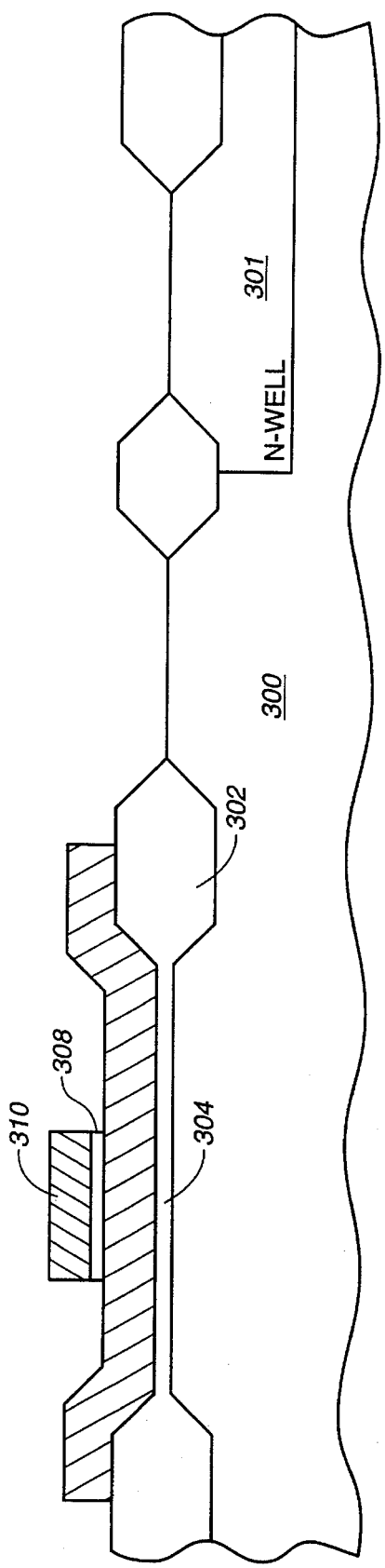
FIG._5b
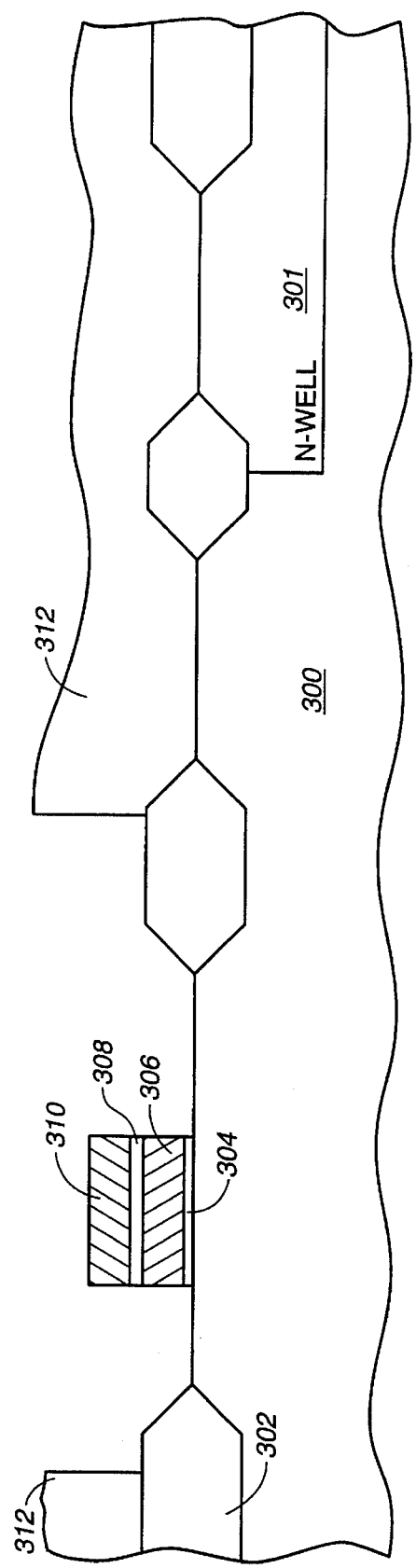
FIG._5c

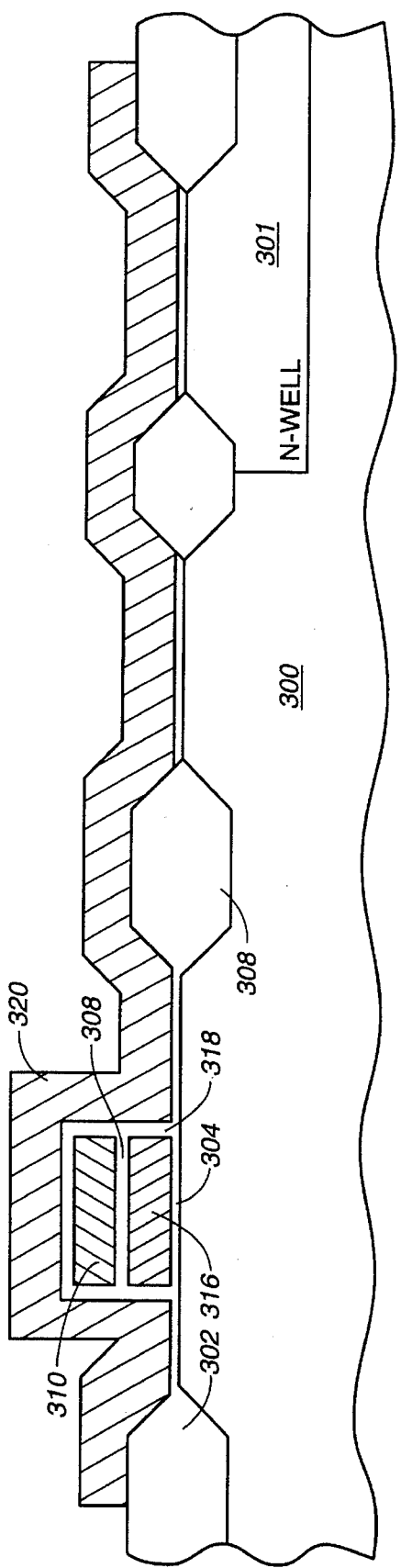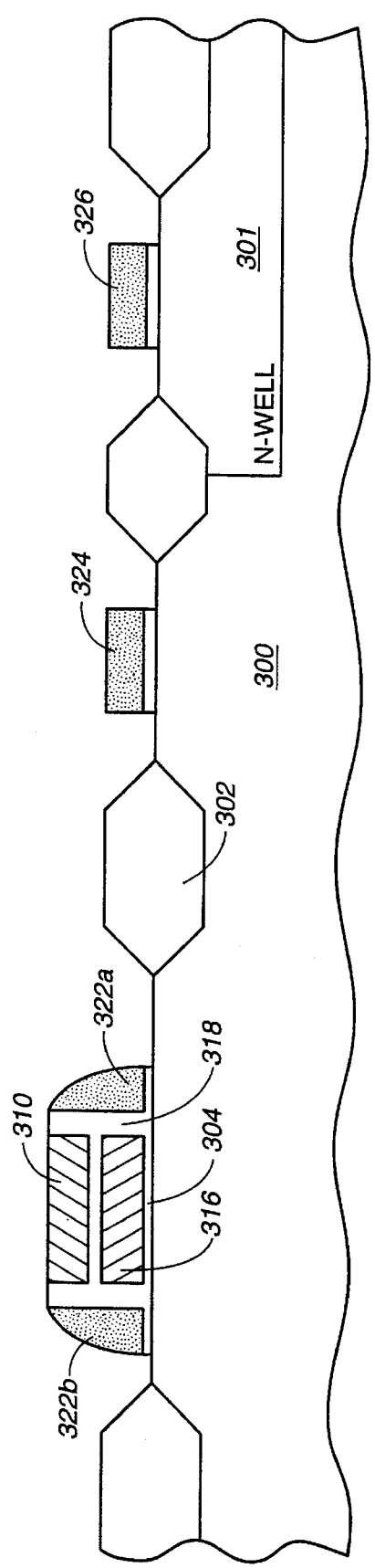
FIG._5d
FIG._5e

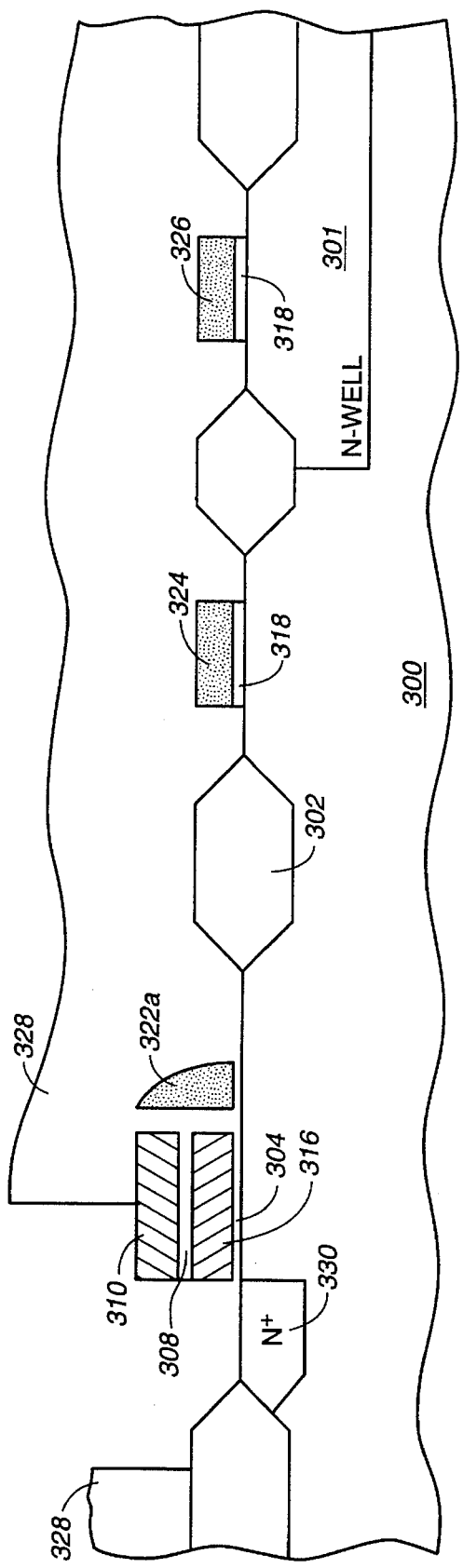
FIG._5f
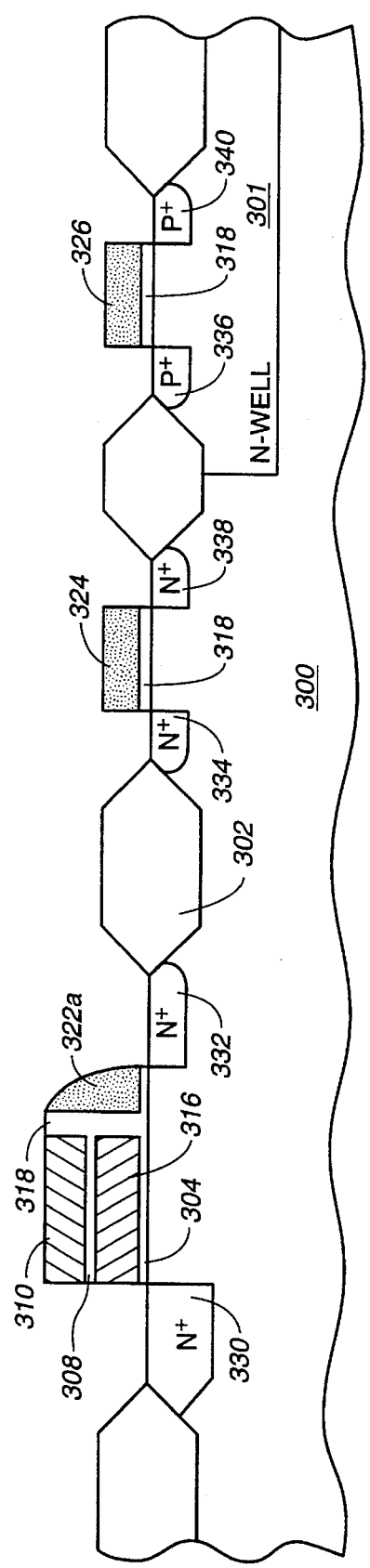
FIG._5g

METHOD OF MAKING FLASH MEMORY CELL

BACKGROUND OF THE INVENTION

1. Field of the Invention

The present invention relates to a polysilicon flash electrically erasable programmable read only memory (i.e., flash EEPROM), particularly a flash EEPROM cell having two or three polysilicon layers, and methods of making same.

2. State of the Art

Electrically programmable ROMs (EPROMs) are memory devices which write data electronically using a technique known as hot electron injection. With hot electron injection, a floating gate is charged to a logic level high by energized carrier electrons. The high energy electrons are then able to pass through an insulator and into the floating gate.

A conventional drain side hot electron programmed EPROM requires a relatively large current for programming and an external high voltage power supply is required in addition to the standard five volt supply. This limits the number of memory cells which can be simultaneously programmed without exceeding the power limitation of the circuit. Further, the device has to be removed from the circuit board for UV erasure of the memory cells.

EPROMS utilizing source side injection can reduce the programming current to a lower level. Although this technology can provide a relatively high density memory and merely requires a standard five volt power supply, it still has to be removed from the circuit board for UV erasure.

The document entitled, "A Novel High-Speed, 5-Volt Programming EPROM Structure with Source-Side Injection," Wu et al., IEDM 86, 1986, pp. 584–587, discloses a conventional source-side injection EPROM (SIEPROM) wherein a high channel electric field is used to generate hot electrons. The high channel electric field is created near the source when a large gate voltage is applied so that both high channel and oxide field exist simultaneously.

FIGS. 1(a)–1(d) of the present application disclose processing steps for manufacturing a SIEPROM in accordance with the Wu document (see also U.S. Pat. No. 4,794,565 issued to Wu et al.). FIG. 1(d) shows a cross-section of an SIEPROM cell which includes a stacked-gate MOSFET with a side wall floating gate 25 (i.e., a polysilicon spacer) on the source side, flanking the stacked gate. A weak gap-controlled channel region is formed under oxide placed between the side wall gate and the stacked gates. By locating a high channel-field near the source, the local gate oxide field is favorable for hot-electron injection.

This SIEPROM cell structure has the advantage that it can be programmed with drain voltages as low as five volts. This five volt level is below the device breakdown level and therefore affords a large tolerance for process control and device design. It is also possible to program the cells with a single five volt power supply since a gate voltage of fifteen volts can be supplied by charge pumping circuitry. Further, even at a low programming voltage, the programming speed of the SIEPROM is faster than that of the drain side injection EPROMs. However, because EPROMs use ultraviolet (UV) light to erase stored data, inconvenient and time consuming removal of the EPROM from a circuit board is still required.

Electrically erasable PROMs (EEPROM or E²PROM) are another variety of known memory devices. EEPROMs do not require a UV light source for erasure and do not necessarily require the memory device to be removed from the circuit board for reprogramming. However, EEPROMS require a select transistor for each memory cell. Accordingly, these devices are relatively large, thus limiting their usefulness in circuits requiring high density memory (i.e., large memory requirements in space limited circuit).

Typically, EEPROM cells are fabricated using metal oxide semiconductor field effect transistors (MOSFETs) as described in U.S. Pat. No. 4,477,883. As shown in FIG. 2(a) of the present application, an EEPROM memory cell is formed with a double layer of polysilicon and three electrodes electrically isolated from each other by oxide films. EEPROMs use this configuration to exploit the known phenomenon of electron tunneling during programming and erasure.

Referring to FIG. 2(a), a first electrode 11 is a floating gate completely encapsulated in an oxide insulating layer. A second electrode 12 is a tunneling gate. Electrons tunnel toward the electrode 12 through a tunnel oxide region 17 between field oxide layers 15 interposed between the electrodes 11 and 12. A third electrode 13 is a coupling gate. The floating gate 11 is capacitively coupled to the coupling gate 13. The combination of the coupling gate 13, the floating gate 11 and the tunneling gate 12 can be represented by the two series connected capacitors shown in FIG. 2(b).

The tunneling gate 12 and the coupling gate 13 control the charge and discharge (programming and erasure) of majority carriers (i.e., electrons) in the floating gate 11. The tunneling gates 12 in a line of memory cells are typically connected together to establish a column line, while the coupling gates 13 are typically connected together in a byte wide configuration.

When data is written into a memory cell, a relatively high voltage (e.g., 20 volts) is supplied via the column line to the tunneling gate 12. When the gate 12 of a cell located at the intersection of the row and column lines is placed at a high potential, a tunneling current flows through the tunnel oxide region 17. Electrons are thereby emitted from the floating gate 11 to write the logic level high.

To erase a logic level high, the coupling electrode 13 (normally kept low for writing operations) is raised to a logic level high while the tunneling gate 12 is placed at a low potential (e.g., ground). As a result, electrons tunnel upward and the floating gate 11 returns to a logic level low. In alternate embodiments, polysilicon-to-polysilicon tunneling has been used to remove floating gate electrons from the floating gate during an erasure mode.

A further development in semiconductor memory devices relates to the use of hot electron injection for programming an EEPROM. EEPROMs which use hot electron injection for programming and which use tunneling for erasure are sometimes referred to as flash EEPROMS.

A flash EEPROM which combines source side injection programming and electron tunnelling erasure has the advantages of high density, a single five volt power supply, and on board electrical programming and erasure. However, integration of a flash EEPROM cell to conventional CMOS fabrication processes can result in degradation of peripheral transistors. Peripheral transistors are, for example, desirable for use as memory control logic.

Because the processing steps currently used to fabricate known memory cells do not account for the fabrication of peripheral transistors on the same substrate, peripheral transistors formed on the same substrate as memory cells are often inferior devices. For example, the performance of the peripheral transistors is severely degraded by high temperature processing steps during fabrication of the memory cells. The inability to fabricate high quality peripheral transistors on a common substrate with memory cells limits practical implementation of the memory cells in an integrated circuit.

SUMMARY OF THE INVENTION

The present invention solves the above problems and others by providing a high density flash EEPROM, operable with a low erase current, to provide fast on-board programming and erasure. Further, the present invention utilizes processing steps which do not significantly degrade peripheral transistors. This results in high quality peripheral transistors having short channels, low threshold voltages, better punch through characteristics, and optimal current drives. Such features permit integration of a flash EEPROM to conventional CMOS fabrication processes.

In an exemplary embodiment, a flash EEPROM memory cell includes a substrate upon which a first dielectric layer is formed. A floating gate is deposited on the dielectric layer and an interpolysilicon dielectric layer is formed on the floating gate. A control gate is formed on the interpolysilicon dielectric layer at least partially above the floating gate. An edge of the control gate above the floating gate is spaced from an edge of the floating gate to form a step configuration with a relatively sharp corner being formed on the floating gate. A side dielectric layer is formed on the step configuration. A side gate is formed on the side dielectric layer and on top of the substrate. A source and a drain region are formed in the substrate outwardly adjacent to the area covered by the combination of the floating gate and the side gate.

When a potential is applied to the side gate, electrons are emitted from the floating gate principally through the relatively sharp corner formed therein. This polysilicon-to-polysilicon emission requires a much lower current when the side gate has a voltage of twenty to thirty volts. This relatively high voltage is easily produced with a conventional voltage boosting circuit. Current leakage between the junction of the source region and the substrate is greatly reduced or eliminated because the tunneling effect is not relied upon. Thus, power requirements are reduced so that many cells can be erased simultaneously, thereby decreasing erase time.

In an alternate exemplary embodiment, the control gate and side gate are formed from a single polysilicon layer deposited over an intermediate dielectric layer. One side of the control gate extends beyond a first side of the floating gate and is terminated on the other side at a position spaced back from the edge of the floating gate. A photolithography technique can be used to pattern the control gate. The side gate is grounded during erasure and electrons are transferred via polysilicon-to-polysilicon tunneling to the control gate.

BRIEF DESCRIPTION OF THE DRAWINGS

These and other advantages and objects of the invention will become more apparent to those skilled in the art upon review of the following detailed description of preferred embodiments when read in conjunction with the attached Figures in which:

FIGS. 1(a)–1(d) show processing steps for a conventional flash EPROM employing source-side injection;

FIGS. 2(a)–2(b) show cross-sectional views of an exemplary conventional double polysilicon EEPROM memory cell;

FIG. 3(a)–3(g) show processing steps in accordance with a first exemplary embodiment of the present invention;

FIG. 4(a)–4(d) show processing steps in accordance with a second exemplary embodiment of the present invention; and FIG. 5(a)–5(g) show processing steps of a method for fabricating multiple layer polysilicon structures which include peripheral transistors.

DETAILED DESCRIPTION OF THE PREFERRED EMBODIMENTS

FIG. 3(a) illustrates initial steps of forming a polysilicon-to-polysilicon hot electron emission EEPROM in accordance with an exemplary embodiment. Initially, a substrate 100 (e.g., p-type doped layer) and a well 101 of a different material (e.g., n-type) are formed. On the substrate 100 and the well region 101, thick field oxide regions 102 are formed (e.g., grown) for circuit component isolation, with a gate oxide layer 104 being formed between the thick field oxide regions 102.

A first polysilicon layer 106 is deposited above the gate oxide layer 104 and partially on top of the thick field oxide regions 102. An interpolysilicon dielectric layer 108 (e.g., oxide) is then formed on top of the first polysilicon layer 106 and a second polysilicon layer 110 is deposited on top of the interpolysilicon dielectric layer 108.

A three-step etching process is then implemented. A photoresist mask 112 is formed on the second polysilicon layer and the control gate 110 is etched (e.g., dry plasma etched) as shown in FIG. 3(b). The dielectric layer 108 is then etched (e.g., anisotropically etched) in alignment with the photoresist mask 112. The first polysilicon layer is then etched away (e.g., anistropically etched) to form a floating gate 116 having side walls aligned with the photoresist mask 112. Because the photoresist 112 protects the control gate 110, the second polysilicon layer used to form control gate 110 can be over-etched as shown by the over-etched area 114 in FIG. 3(c) to create a relatively sharp corner 116a in the floating gate 116. This causes a side wall (or edge) of the control gate 110 to be spaced from a side wall of the floating gate 116, and forms a step configuration which promotes polysilicon-to-polysilicon hot electron emission.

The photoresist 112 is then removed and a second dielectric layer 118 is formed on top of control gate 110 and on the side of control gate 110 and floating gate 106, as shown in FIG. 3(d). The dielectric layer 118 is also used to form dielectric layers for each of the peripheral transistors. However, it will be appreciated that any of the dielectric layers can be used to form the peripheral transistors. Thereafter, a third polysilicon layer 120 is deposited over the existing structure into peripheral field regions which are separated by thick field oxide layers 102 from the memory cell. The third polysilicon layer is then anisotropically etched to form side gates 122a and 122b on either side of the floating gate 116 and control gate 110, as shown in FIG. 3(e). Additionally, polysilicon peripheral transistor gates 124 and 126 remain after the etching process of the third polysilicon layer in the peripheral regions, as shown in FIG. 3(e).

A photoresist 128 is then deposited over the peripheral regions and approximately half of the stacked gate structure of control gate 110, floating gate 106 and side gate 122a. The second side gate 122b is removed by an etching process as shown in FIG. 3(f).

The photoresist 128 is removed and source region 132 and drain region 130 are formed on either side of the memory cell structure, which includes control gate 110, floating gate 116 and side gate 122a, as shown in FIG. 3(g). Further, source regions 134 and 138 and drain regions 136 and 140 of peripheral transistors are formed (e.g., implanted) on either side of the polysilicon gates 124 and 126, respectively.

An NMOS transistor and a PMOS transistor are shown on the same substrate to reflect that the present invention is integratible with CMOS (complementary metal-oxide-semiconductor) devices. Naturally, peripheral transistors of various types may exist about the memory cell structure. For example, the transistors can be of the double diffused (DDD) type or the lightly doped drain (LDD) type.

A DDD transistor involves forming source and drain regions about a gate through diffusion and then rediffusing dopant in the source and drain regions to increase the profile of these regions. The increased regions extend partially underneath the gate.

An LDD transistor is formed as a gate with lightly doped regions on either side. A side oxide spacer is formed on two sides of the gate and the regions extending outside the side oxide layers are heavily doped. Thus, a lightly doped area can be formed in substantial alignment with a sidewall of the floating gate 116 and a heavily doped area can be formed in substantial alignment with an edge of the side oxide layer. A side oxide spacer 131, a lightly doped region 133 and a heavily doped region 135 are illustrated in FIG. 3(g) using dotted lines. As referenced herein the phase "substantial alignment" refers to the use of a patterned layer, polysilicon or otherwise, as an intended mask during an implant, and includes the use of additional layers which can be placed over the intended mask layer to mitigate or prevent implant penetration into the intended mask layer. Both the DDD and LDD type transistors are well known in the art.

After the above semiconductor structure is formed, electrical contacts 150, 152, 154, 156, 158, 160, 162, 164 are established on the source (S) regions 132, 134 and 138, the drain (D) regions 130, 136 and 140, on the side gate (SG) 122a and on the control gate (CG) 110. These contacts are, of course, connected to circuitry (not shown) to bias the various regions and gates.

As explained above, this structure uses polysilicon-to-polysilicon hot electron emission for erasure. This assures a low erase current. It also eliminates difficult tunnel oxide growth and etch problems. For programming, a standard hot electron source-side programming scheme is used. The source-side injection for programming provides high efficiency and low current requirements.

Table 1 lists exemplary voltage potentials that are applied to the various contacts:

TABLE 1

|  | $V_D$ | $V_{CG}$ | $V_{SG}$ | $V_S$ | I |
| --- | --- | --- | --- | --- | --- |
| Pgm | 5 | 15 | –2 | gnd | <20 μA |
| erase | gnd | gnd | 15–25 | gnd | <1 nA |

During programming, the voltage on the drain 130 is shown as 5 volts while the voltage on the control gate 110 is shown as 15 volts and the voltage on the side gate 122a is shown as approximately 2 volts. This promotes transition of electrons from the source region 132 into the floating gate 116 when the voltage on the source region 132 is grounded. The resulting current between source 132 and drain 130 is approximately 20 microAmps or less.

During erasure, the voltage on the drain region 130 is grounded while the voltage on the control gate 110 is grounded. The voltage on the side gate 122a is raised to a relatively high level of 15 to 25 volts and the source region 132 is grounded. Electrons within the floating gate are attracted to the side gate 122a, thereby depleting the electron population and erasing the contents of the memory cell. This polysilicon-to-polysilicon emission current is less than 1 nA.

FIGS. 4(a) through 4(d) illustrate a simplified structure which uses only two polysilicon layers in its production rather than three. As shown in FIG. 4(a) a substrate 200 is formed with a well 201 of different conductivity type and thick field oxide layers 202 are formed to isolate various circuit components. A first polysilicon layer is formed and patterned (e.g., photolithographically) on a gate oxide layer 204. The patterned polysilicon layer represents a floating gate 216. A drain region 203 (FIG. 4(a)) is formed by doping the substrate with a conductivity type different than the substrate. The lightly doped drain region 203 is thus implanted in the substrate in substantial alignment with the sidewall of floating gate 216.

As shown in FIG. 4(b), an interpolysilicon dielectric 208 is formed on top and on the sides of the first dielectric layer which forms the floating gate 216. A second polysilicon layer 210 is deposited over the floating gate 216 and the dielectric layer 208, as well as over peripheral regions separated from the memory cell structure by field oxide layers 202 representing isolation regions.

A photoresist 212 is formed to define the control gate 242 and gates 224 and 226 of peripheral transistors. Because a separate photolithography step is used to form the control gate rather than a self-alignment technique, and due to the limitations of the photolithography technique in aligning the masks, this second embodiment is roughly 20% larger than the first.

The second polysilicon layer 210 is then anisotropically etched to form the control gate 242, peripheral transistor gates 224 and 226 as well as side gate 222. The side gate is separated from the control gate 242 and positioned adjacent to the floating gate 216.

This etching process results in the control gate 242 being formed on top of, and on one side of, the floating gate 216, with the control gate and the floating gate being separated by the interpolysilicon layer 208. The control gate 242 also partially covers the drain region 203 as shown in FIG. 4(c). The substrate 200 is then heavily doped with dopants of a conductivity type opposite the conductivity type of the local substrate. This results in drain region 230 being formed in substantial alignment with a sidewall of the control gate such that it is suitable for receiving an electrical contact 250 and for being electrically connected to the floating gate by the lightly doped region 203.

As shown in FIG. 4(d), a source region 232 is formed outwardly adjacent to the side gate 222 (e.g., via ion implantation). Source regions 234 and 238 as well as drain regions 236 and 240 are formed adjacent the peripheral transistor gates 224 and 226. Electrical contacts 250, 252, 254, 256, 258, 260, 262 and 264 are established on memory cell source and drain regions 230 and 232, control gate 242, side gate 222, and the source and drain regions 234, 236, 238, 240 of the peripheral transistors.

It should be noted that PMOS and NMOS transistors are shown for purposes of illustrating that the present invention can be integrated in a CMOS device. Naturally, transistors of various types may exist as peripheral transistors to the memory cell.

The embodiment of the invention illustrated in FIG. 4 operates somewhat differently than the FIG. 3 embodiment. As in the FIG. 3 embodiment, source-side hot electron injection is used for programming, which demonstrates a high electron efficiency. Also, polysilicon-to-polysilicon emission is used to erase the memory cell location to assure low erase current. However, instead of the electron emission occurring between floating gate 216 and side gate 222, the emission takes place between a relatively sharp corner of the floating gate 216 and control gate 242.

Table 2 illustrates various exemplary voltages applied to the electrical contacts of the source region 232, the drain region 230, the control gate 242 and the side gate 222 during programming or erasure on the memory cell.

TABLE 2

|  | $V_D$ | $V_{CG}$ | $V_{SG}$ | $V_S$ | I |
|---|---|---|---|---|---|
| Pgm | 5 | 15 | ~2 | gnd | <20 μA |
| erase | float | 15–25 | gnd | gnd | <1 nA |

As shown in Table 2, during programming the voltage applied to the drain region 230 is 5 volts, while 15 volts is applied to the control gate 242 and approximately 2 volts is applied to the side gate 222. The voltage of the source region 232 is grounded and this results in a current of approximately 20 microAmps or less between the source region 232 and floating gate 216.

During the erasing procedure for the memory cell, the drain region 230 is floating while the voltage of the control gate 242 is raised to 15 to 25 volts. The voltage of the side gate 222 is grounded. Again, the source region 232 is grounded. This results in less than 1 nanoAmp of current between the control gate 256 and the floating gate 216.

The FIG. 4 embodiment is advantageous in that only two polysilicon layers are used in manufacturing the device. However, a small sacrifice in circuit density occurs because a separate photolithography technique is used to form both the control gate and floating gate rather than the single photolithography step of the FIG. 3 self-aligning technique. Nevertheless, the circuit density is still much greater than that of a conventional EEPROM device.

Those skilled in the art will recognize that modifications can be made to the foregoing process steps. For example, alternate processing steps of the FIG. 4 embodiment include defining the drain region 230 after the first polysilicon etch. Also, the second polysilicon etch can be used to mask the control gate 242 while forming the spacer, or side gate 222, around another side of the floating gate 216.

In addition to the manufacturing processes mentioned above, the present invention also includes a process which takes into account the formation of peripheral transistors. In accordance with the present invention, the process utilized for forming multiple layer polysilicon devices generally involves the formation of the transistor gates in peripheral regions of the multiple layer polysilicon device by using the polysilicon layer formed last in time.

In conventional processes, the first or second polysilicon layer is used to form the gates of peripheral transistors. However, because a high temperature cycle occurs between the formation of each polysilicon layer, this conventional process degrades peripheral transistors. Accordingly, a process of the present invention uses the last formed polysilicon layer to form peripheral transistor gates, and thus avoids a high temperature cycle from degrading the peripheral transistors.

FIGS. 5(a) through 5(g) illustrate an example of this process using figures which are similar to FIGS. 3(a) through 3(g). After formation of a well 301 (FIG. 5(a)) of different conductivity type in the substrate 300, and after the formation of field oxide layer isolation regions 302, a gate or tunnel oxide layer 304 is formed. A first polysilicon layer 306 is formed on at least the gate oxide layer 304. An intermediate dielectric layer 308 is formed on the first polysilicon layer 306 and thereafter a second polysilicon layer 310 is formed and patterned (e.g., photolithographically) on top of the intermediate dielectric layer 308 as shown in FIG. 5(b).

The second polysilicon layer 310 can be coated with a protective layer and used as a self-aligned mask for etching the first polysilicon layer 306 to form the first polysilicon gate 316 as shown in FIG. 5(c). Alternately, a photolithography technique can be used to form the gates 310 and 316, and to permit over-etching of the second polysilicon layer 310 in a manner similar to that described with respect to FIG. 3(c). A photoresist 312 is applied to the device outside the area of the first polysilicon layer 306 prior to etching the layer 306 as shown in FIG. 5(c). This photoresist layer can also be applied over the layer 310 in FIG. 5(c) if an over-etch of the control gate is desired.

FIG. 5(d) shows a second dielectric layer 318 formed on the top of the second polysilicon layer 310 and on the sides of the first polysilicon layer 316 and second polysilicon layer 310. After removal of the photoresist 312, a third polysilicon layer 320 is formed over the stacked polysilicon layers 310 and 316, as well as the isolation regions 302 and peripheral regions of the semiconductor substrate.

FIG. 5(e) shows the result of an etching (e.g., anisotropic etching) to produce side polysilicon layers 322a and 322b. These side layers are formed on opposing sides of the stacked configuration of the first polysilicon layer 316 and second polysilicon layer 310. The etching process shown in FIG. 5(e) also defines peripheral transistor gates 324 and 326. It is important to note that the peripheral transistor gates 324 and 326 are formed from the polysilicon layer formed last in time.

FIGS. 5(f) and 5(g) illustrate the result of ion implantation, after removing one of the side polysilicon layers 322b using photoresist 328. A drain region 330 is implanted adjacent to the stacked gate configuration of first polysilicon layer 316 and second polysilicon layer 310. Thereafter, as shown in FIG. 5(g), a source region 332 of the stacked gate configuration is formed along with the drain and source regions 334, 336, 338 and 340 associated with the peripheral transistor gates 324 and 326.

The dielectric layers mentioned above may be formed of any suitable dielectric material such as silicon dioxide, silicon nitride, tantalum oxide and composite dielectric material such as oxide-nitride or oxide-nitride-oxide. The deposition of the various layers and materials may be done by any suitable process, such as vacuum, electrical, chemical, screening, or vapor methods.

The processing steps above are intended to be illustrative rather than limitive and any suitable processing technique may be used at any particular step. These conventional techniques include photoresist, self-aligned etching, anisotropic etching, photoresist masking, and other standard processing steps.

It should further be noted that the device disclosed can be erased by irradiation with ultraviolet light to function as an EPROM cell. However, as disclosed above, the device actually functions as a EEPROM device since electrons are depleted from the floating gate 116 or 216 through polysilicon-to-polysilicon emission.

It will be appreciated by those skilled in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell and being patterned for preventing electron leakage of a gate of said memory cell during erasure; and forming at least one peripheral transistor on said substrate, said at least one peripheral transistor having a gate, said step of forming at least one peripheral transistor further including forming said gate of said peripheral transistor with said one of said at least two patterned polysilicon layers for preventing electron leakage of said gate of said memory cell during erasure.

2. A method according to claim 1 wherein said step of forming said one of said at least two patterned polysilicon layers further includes the step of:

forming and patterning said one of said at least two polysilicon layers over at least a portion of at least one of said remaining polysilicon layers.

3. A method according to claim 1 wherein said step of forming a memory cell further includes a step of:

forming said memory cell with at least three patterned polysilicon layers.

4. A method according to claim 3 further comprising the step of:

patterning a second of said at least three polysilicon layers over a first of said at least three patterned polysilicon layers, prior to patterning said one of said at least two polysilicon layers.

5. A method according to claim 2, wherein said step of patterning further includes a step of:

patterning another of said at least two polysilicon layers using said one of said at least two polysilicon layers as a self-aligned mask.

6. A method according to claim 2, wherein said step of patterning further includes a step of:

using a photoresist patterning technique.

7. A method according to claim 1, further including a step of:

double diffusing a source and a drain for each peripheral transistor to form a double diffused drain (DDD) type transistor.

8. A method according to claim 1, further including steps of:

lightly doping an area of said substrate aligned with a sidewall of a gate of said memory cell; and heavily doping an area in a portion of said substrate adjacent said lightly doped area.

9. A method according to claim 8, further including a step of:

forming an oxide spacer adjacent said sidewall of said memory cell gate, said heavily doped area being formed in substantial alignment with said oxide spacer.

10. A method according to claim 8, further including a step of:

forming said one of said at least two polysilicon layers in a step configuration, a portion of said one of said at least two polysilicon layers being formed over said lightly doped area, and said heavily doped area being formed in substantial alignment with a sidewall of said one of said at least two polysilicon layers.

11. A method according to claim 1, further including a step of:

patterning a first of said at least two patterned polysilicon layers of the memory cell over the substrate;

patterning a second of said at least two patterned polysilicon layers over a portion of said first patterned polysilicon layer; and patterning said one of said at least two polysilicon layers adjacent said first and second polysilicon layers.

12. A method according to claim 11, further including a step of:

spacing a sidewall of said second patterned polysilicon layer from a sidewall of said first patterned polysilicon layer to form a step configuration.

13. A method according to claim 1, further including a step of:

patterning a first of said at least two patterned polysilicon layers of said memory cell over the substrate; and patterning said one of said at least two polysilicon layers to form a stepped control gate over a portion of a drain of the memory cell and over a portion of the first patterned polysilicon layer.

14. A method according to claim 11, wherein said step of patterning said one of said at least two polysilicon layers further includes a step of:

patterning said one of said at least two polysilicon layers to form a side gate adjacent a sidewall of said first patterned polysilicon layer.

15. A method according to claim 1, wherein said step of forming at least one peripheral transistor further includes a step of:

forming said gate of said peripheral transistor from a polysilicon layer formed on a side of at least one of a control gate and a floating gate of said memory cell.

16. A method according to claim 1, wherein said step of forming at least one peripheral transistor further includes a step of:

forming said gate of said peripheral transistor with a polysilicon layer used for source side hot electron injection of said memory cell.

17. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell;

forming at least one peripheral transistor on said substrate, said at least one peripheral transistor having a gate formed from said one of said at least two patterned polysilicon layers;

lightly doping an area of said substrate aligned with a sidewall of a memory cell gate formed with one of said remaining polysilicon layers;

heavily doping an area in a portion of said substrate adjacent said lightly doped area; and forming said one of said at least two polysilicon layers in a step configuration, a portion of said one of said at least two polysilicon layers in said step configuration being formed over said lightly doped area, and said heavily doped area being formed in substantial alignment with a sidewall of said one of said at least two polysilicon layers which is formed in said step configuration.

18. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell;

forming at least one peripheral transistor on said substrate, said at least one peripheral transistor having a gate formed from said one of said at least two patterned polysilicon layers;

patterning a first of said at least two patterned polysilicon layers of the memory cell over the substrate;

patterning a second of said at least two patterned polysilicon layers over a portion of said first patterned polysilicon layer;

patterning said one of said at least two polysilicon layers adjacent said first and second polysilicon layers; and spacing a sidewall of said second patterned polysilicon layer from a sidewall of said first patterned polysilicon layer to form a step configuration.

19. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell;

forming at least one peripheral transistor on said substrate, said at least one peripheral transistor having a gate formed from said one of said at least two patterned polysilicon layers, wherein said step of forming at least one peripheral transistor further including a step of:

forming said gate of said peripheral transistor from a polysilicon layer formed adjacent a sidewall of at least one of a control gate and a floating gate of said memory cell.

20. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell; and forming at least one peripheral transistor on said substrate, said at least one peripheral transistor having a gate formed from said one of said at least two patterned polysilicon layers, said step of forming at least one peripheral transistor further including a step of:

forming said gate of said peripheral transistor with a polysilicon layer used for source side hot electron injection of said memory cell.

21. A method of manufacturing a multilayer polysilicon device including peripheral transistors, said method comprising the steps of:

forming a memory cell having at least two patterned polysilicon layers on a substrate, with one of said at least two patterned polysilicon layers being patterned subsequent to formation of remaining polysilicon layers used to form said memory cell;

lightly doping an area of said substrate aligned with a sidewall of a memory cell gate formed with one of said remaining polysilicon layers;

heavily doping an area in a portion of said substrate adjacent said lightly doped area; and forming said one of said at least two polysilicon layers in a step configuration, a portion of said one of said at least two polysilicon layers in said step configuration being formed over said lightly doped area, and said heavily doped area being formed in substantial alignment with a sidewall of said one of said at least two polysilicon layers which is formed in said step configuration.

22. A method according to claim 19, wherein said step of forming said one of said at least two pattered polysilicon layers further includes the step of:

forming and patterning said one of said at least two polysilicon layers over at least a portion of at least one of said remaining polysilicon layers.

23. A method according to claim 19, wherein said step of forming a memory cell further includes a step of:

forming said memory cell with at least three patterned polysilicon layers.

24. A method according to claim 23, further comprising the step of:

patterning a second of said at least three polysilicon layers over a first of said at least three pattered polysilicon layers, prior to patterning said one of said at least two polysilicon layers.

25. A method according to claim 19, further including steps of:

lightly doping an area of said substrate aligned with a sidewall of a gate of said memory cell; and heavily doping an area in a portion of said substrate adjacent said lightly doped area.

26. A method according to claim 25, further including a step of:

forming said one of said at least two polysilicon layers in a step configuration, a portion of said one of said at least two polysilicon layers being formed over said lightly doped area, and said heavily doped area being formed in substantial alignment with a sidewall of said one of said at least two polysilicon layers.

27. A method according to claim 19, further including a step of:

patterning a first of said at least two patterned polysilicon layers of the memory cell over the substrate;

patterning a second of said at least two patterned polysilicon layers over a portion of said first patterned polysilicon layer; and patterning said one of said at least two polysilicon layers adjacent said first and second polysilicon layers.

28. A method according to claim 27, further including a step of:

spacing a sidewall of said second patterned polysilicon layer from a sidewall of said first patterned polysilicon layer to form a step configuration.

29. A method according to claim 19, further including a step of:

patterning a first of said at least two patterned polysilicon layers of said memory cell over the substrate; and patterning said one of said at least two polysilicon layers to form a stepped control gate over a portion of a drain of the memory cell and over a portion of the first patterned polysilicon layer.

30. A method according to claim 20, wherein said step of forming said one of said at least two pattered polysilicon layers further includes the step of:

forming and patterning said one of said at least two polysilicon layers over at least a portion of at least one of said remaining polysilicon layers.

31. A method according to claim 20, wherein said step of forming a memory cell further includes a step of:

forming said memory cell with at least three patterned polysilicon layers.

32. A method according to claim 31, further comprising the step of:

patterning a second of said at least three polysilicon layers over a first of said at least three pattered polysilicon layers, prior to patterning said one of said at least two polysilicon layers.

33. A method according to claim 20, further including steps of:

lightly doping an area of said substrate aligned with a sidewall of a gate of said memory cell; and heavily doping an area in a portion of said substrate adjacent said lightly doped area.

34. A method according to claim 33, further including a step of:

forming said one of said at least two polysilicon layers in a step configuration, a portion of said one of said at least two polysilicon layers being formed over said lightly doped area, and said heavily doped area being formed in substantial alignment with a sidewall of said one of said at least two polysilicon layers.

35. A method according to claim 20, further including a step of:

patterning a first of said at least two patterned polysilicon layers of the memory cell over the substrate;

patterning a second of said at least two patterned polysilicon layers over a portion of said first patterned polysilicon layer; and patterning said one of said at least two polysilicon layers adjacent said first and second polysilicon layers.

36. A method according to claim 35, further including a step of:

spacing a sidewall of said second patterned polysilicon layer from a sidewall of said first patterned polysilicon layer to form a step configuration.

37. A method according to claim 20, further including a step of:

patterning a first of said at least two patterned polysilicon layers of said memory cell over the substrate; and patterning said one of said at least two polysilicon layers to form a stepped control gate over a portion of a drain of the memory cell and over a portion of the first patterned polysilicon layer.

38. A method according to claim 21, wherein said step of forming said one of said at least two pattered polysilicon layers further includes the step of:

forming and patterning said one of said at least two polysilicon layers over at least a portion of at least one of said remaining polysilicon layers.

39. A method according to claim 21, wherein said step of forming a memory cell further includes a step of:

forming said memory cell with at least three patterned polysilicon layers.

40. A method according to claim 39, further comprising the step of:

patterning a second of said at least three polysilicon layers over a first of said at least three pattered polysilicon layers, prior to patterning said one of said at least two polysilicon layers.

41. A method according to claim 21, further including a step of:

patterning a first of said at least two patterned polysilicon layers of the memory cell over the substrate;

patterning a second of said at least two patterned polysilicon layers over a portion of said first patterned polysilicon layer; and patterning said one of said at least two polysilicon layers adjacent said first and second polysilicon layers.

42. A method according to claim 41, further including a step of:

spacing a sidewall of said second patterned polysilicon layer from a sidewall of said first patterned polysilicon layer to form a step configuration.

43. A method according to claim 21, further including a step of:

patterning a first of said at least two patterned polysilicon layers of said memory cell over the substrate; and patterning said one of said at least two polysilicon layers to form a stepped control gate over a portion of a drain of the memory cell and over a portion of the first patterned polysilicon layer.

* * * * *